(12) United States Patent
Lin et al.

(10) Patent No.: US 7,026,656 B2
(45) Date of Patent: Apr. 11, 2006

(54) WHITE LIGHT-EMITTING DEVICE

(75) Inventors: Yi-Shan Lin, Nan Tou Hsien (TW); Ru-Shi Liu, Hsinchu Hsien (TW); Hung-Yuan Su, Taipei Hsien (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 10/944,806

(22) Filed: Sep. 21, 2004

(65) Prior Publication Data

US 2005/0247951 A1    Nov. 10, 2005

(30) Foreign Application Priority Data

May 7, 2004    (TW)    ................. 93112964 A

(51) Int. Cl.
*H01L 53/00*    (2006.01)
(52) U.S. Cl. ................. 257/88; 257/89; 257/98; 257/100

(58) Field of Classification Search ........... 257/79–103
See application file for complete search history.

(56) References Cited

U.S. PATENT DOCUMENTS 6,812,500 B1 *   11/2004   Reeh et al. ................. 257/98
6,844,671 B1 *    1/2005   Setlur et al. ............... 313/503
6,921,928 B1 *    7/2005   Sonobe ....................... 257/99

* cited by examiner

*Primary Examiner*—Cuong Nguyen
(74) *Attorney, Agent, or Firm*—Birch, Stewart, Kolasch & Birch, LLP

(57)    ABSTRACT

A white light-emitting device has a semiconductor light-emitting chip, configured to emit light and at least one $(Ba_{1-x}M_x)Al_2O_4$ phosphor to absorb the light emitted from the semiconductor light-emitting chip to emit a white light, where M is consisted of at least one of Eu, Bi, Mn, Ce, Tb, Gd, La, Mg and Sr, $1>x>0$.

17 Claims, 4 Drawing Sheets

WHITE LIGHT-EMITTING DEVICE

This Nonprovisional application claims priority under 35 U.S.C. §119(a) on Patent Application No(s). 93112964 filed in Taiwan, Republic of China on May 7, 2004, the entire contents of which are hereby incorporated by reference.

BACKGROUND OF THE INVENTION

1. Field of the Invention

The invention relates to a white light-emitting device, and more particularly to a light-emitting device including one white phosphor that can absorb light emitted from a semiconductor light-emitting chip to generate a white light.

2. Description of the Related Art

White light is a light mixed from a plurality of lights of different colors. Visible white light is one generated by mixing least two lights of different wavelengths. For example, when the eyes are simulated by red, blue and green lights at the same time, or by blue and yellow lights at the same time, they recognize the incident light as a white light. A light-emitting diode (LED) light source is made with this theory in mind. Four processes are commonly used to generate a white light for a convention LED device. The first process uses InGaAlP, GaP and GaN to make LED devices that respectively control currents passing through LED devices to generate the red, green and blue lights. Since these three LED devices are placed in one lamp, a lens of the lamp mixes the lights emitted from the LED devices to generate white light. The second process uses GaN and GaP to make two LED devices for controlling an electrical current passing the LED devices to emit blue and yellow-green lights, respectively. The blue and yellow-green lights are mixed to generate a white light. These two methods provide 20 lm/W. However, if one of the LED devices responsible for providing a specific color of light is non-functional, then white light will typically not be obtained. Furthermore, since positive biases applied on these LED devices are different, several control circuits to control the biases are required, causing an increase in production costs. The third process was developed by Nichia Chemical Company, Japan, in 1996, and uses InGaN blue diode and yellow yttrium aluminum garnet powders to provide white light. The process currently provides 15 lm/W, which is less than that provided by the above two processes; however, only one LED device is needed. This process has been successfully commercialized due to the mature technology of preparing the phosphors powder. The second process and the third processes implement the complementary color principle to generate white light. The continuity of the spectrum wavelength distribution is not as good as that of sunlight. Therefore, white light obtained by mixing lights appears non-uniform color in the visible light range (400 nm–700 nm), resulting in low color saturation. Although the human eye can neglect the phenomenon and just see white light, high-precision optical detecting equipment such as a camera or a picture shooting device has a color rendering property. That is, errors may occur when colors of an object return to their original conditions. Therefore, white light generated by such a process is only suitable for simple illumination applications. A fourth process was developed by Sumitomo Electric Industries, Ltd, Japan in 1999. In the fourth process, a CdZnSe film is formed on a ZeSe single-crystal substrate to emit a blue light. The blue light also radiates on the substrate to emit a yellow light. The blue light and the yellow light form complementary colors and generate white light. In this process, one LED device is used and the operational voltage is only 2.7V, rather smaller than the 3.5V needed by the LED device formed on GaN. No phosphor is needed for obtaining white light. However, its main disadvantage is that it provides only 8 lm/W of illumination, and the service life thereof is only 8000 hours, which limits the applications thereof.

In the currently used LED devices, three or more phosphors are stimulated to emit specific lights that are then mixed to generate white light. They are potentially replacements for fluorescent lamps or bulbs in the future. Stimulating the phosphors to emit light requires specific exciting lights that can be exactly absorbed by the phosphors at the same time. Therefore, there cannot be significant difference between the absorption coefficients of the phosphors for the exciting lights. Quantum efficiencies in optical energy conversion for the phosphors are preferably as similar as possible. Such a complicated process is not the best candidate for obtaining white light.

SUMMARY OF THE INVENTION

The invention provides a white light-emitting device, in which a semiconductor light-emitting chip emits a light that is absorbed by the $(Ba_{1-x}M_x)Al_2O_4$ phosphor (M is consisted of at least one of Eu, Bi, Mn, Ce, Tb, Gd, La, Mg and Sr, $1>x>0$) to emit blue-green light.

According to the present invention, a white light-emitting device includes a semiconductor light-emitting chip and at least one $(Ba_{1-x}M_x)Al_2O_4$ phosphor. The semiconductor light-emitting chip is configured to emit lights. The $(Ba_{1-x}M_x)Al_2O_4$ phosphor absorbs the light emitted from the semiconductor light-emitting chip, and excites a first color light, in which M is consisted of at least one of Eu, Bi, Mn, Ce, Tb, Gd, La, Mg and Sr, $1>x>0$.

The white light-emitting device enhances white light-emitting performance, and can be produced with a simple process and a low cost, as well. Therefore, it is of highly industrial utility To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF PREFERRED EMBODIMENTS

Figure 1:
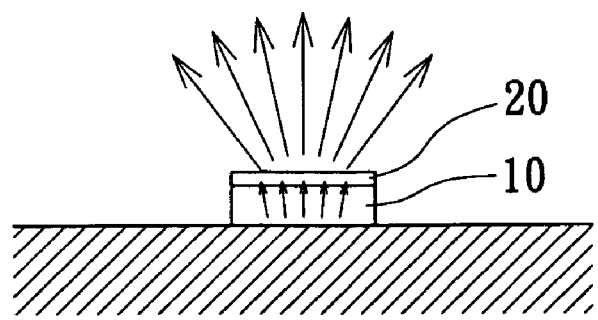
FIG. 1 is a schematic view of a white light-emitting device according to a first embodiment of the invention.

Wherever possible in the following description, like reference numerals will refer to like elements and parts unless otherwise illustrated.

Figure 2:
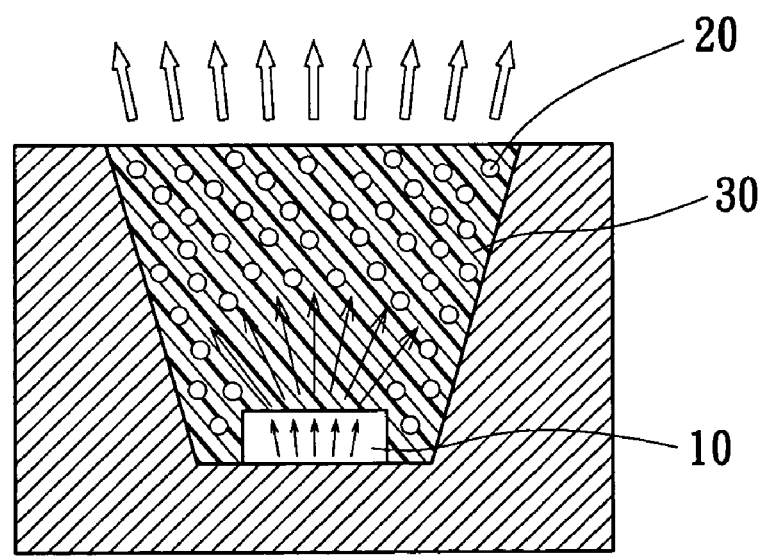
FIG. 2 is a schematic view of a white light-emitting device according to a second embodiment of the invention.

Referring to FIG. 1 and FIG. 2, a white light-emitting device of the invention includes a semiconductor light-emitting chip 10, and at least one $(Ba_{1-x}M_x)Al_2O_4$ phosphor 20 (where M is consisted of at least one of Eu, Bi, Mn, Ce, Tb, Gd, La, Mg and Sr, 1>x>0). The $(Ba_{1-x}M_x)Al_2O_4$ phosphor 20 absorbs light emitted from the semiconductor light-emitting chip 10 to emit a white light.

The light emitted from the semiconductor light-emitting chip 10 is ultraviolet light with a wavelength of 300 nm to 400 nm. Ultraviolet light is absorbed by the $(Ba_{1-x}M_x)Al_2O_4$ phosphor 20 to emit white light with a wavelength of 400 nm to 700 nm. The $(Ba_{1-x}M_x)Al_2O_4$ phosphor 20 can be further mixed with an appropriate amount of rare earth elements as optically active centers or a sensitivity increasing agent can be added into the $(Ba_{1-x}M_x)Al_2O_4$ phosphor 20 to increase the brightness. In practice, the $(Ba_{1-x}M_x)Al_2O_4$ phosphor 20 can be formed on an illuminating film of the semiconductor light-emitting chip 10 as shown in FIG. 1. Alternatively, the phosphor is mixed with an encapsulant 30, as shown in FIG. 2. An electrical current passing through the semiconductor light-emitting chip 10 stimulates the chip 10 to emit ultraviolet light. The phosphor 20 absorbs ultraviolet light to emit white light.

Figure 3:
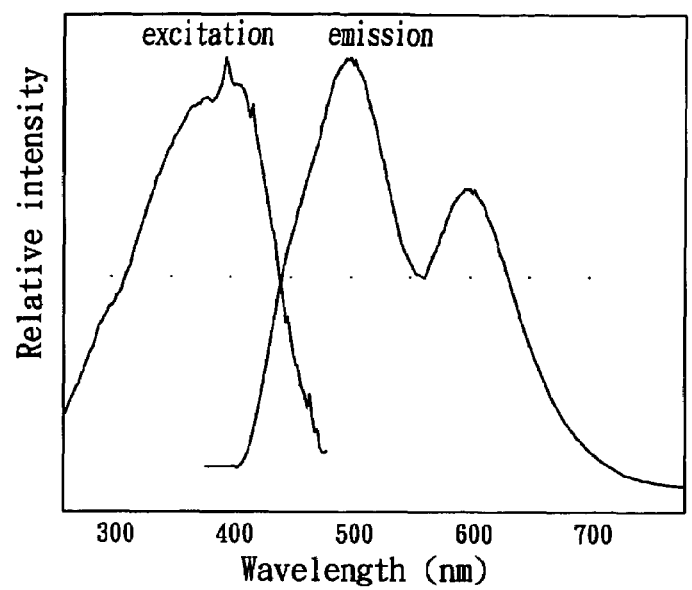
FIG. 3 is excitation and emission spectra of phosphor used in the invention.

FIG. 3 is excitation and emission spectra of phosphor used in the invention.

Figure 4:
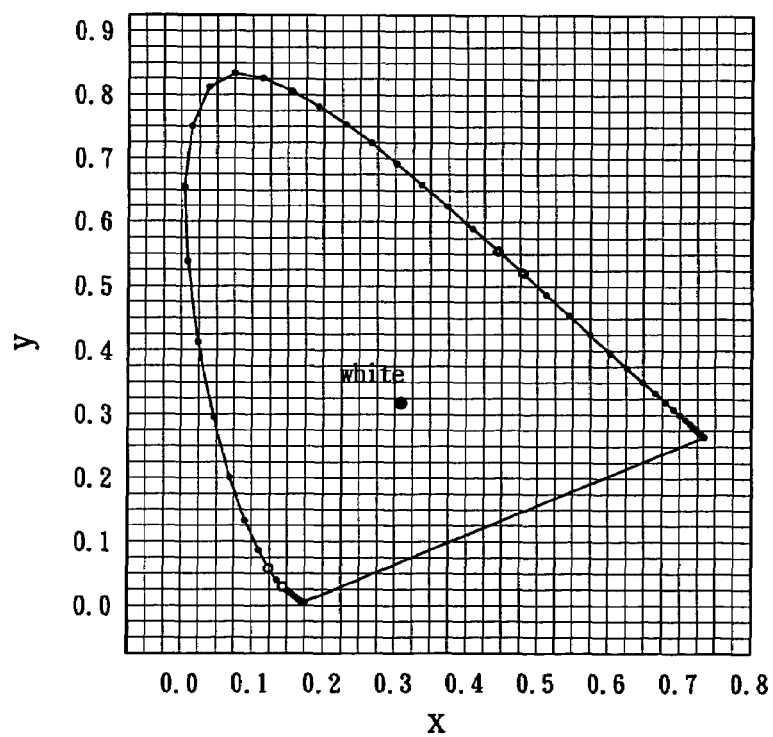
FIG. 4 is a colorimetric coordinate converted from the emission spectra of FIG. 3.

FIG. 4 is a colorimetric coordinate converted from the emission spectra of FIG. 3.

Figure 5:
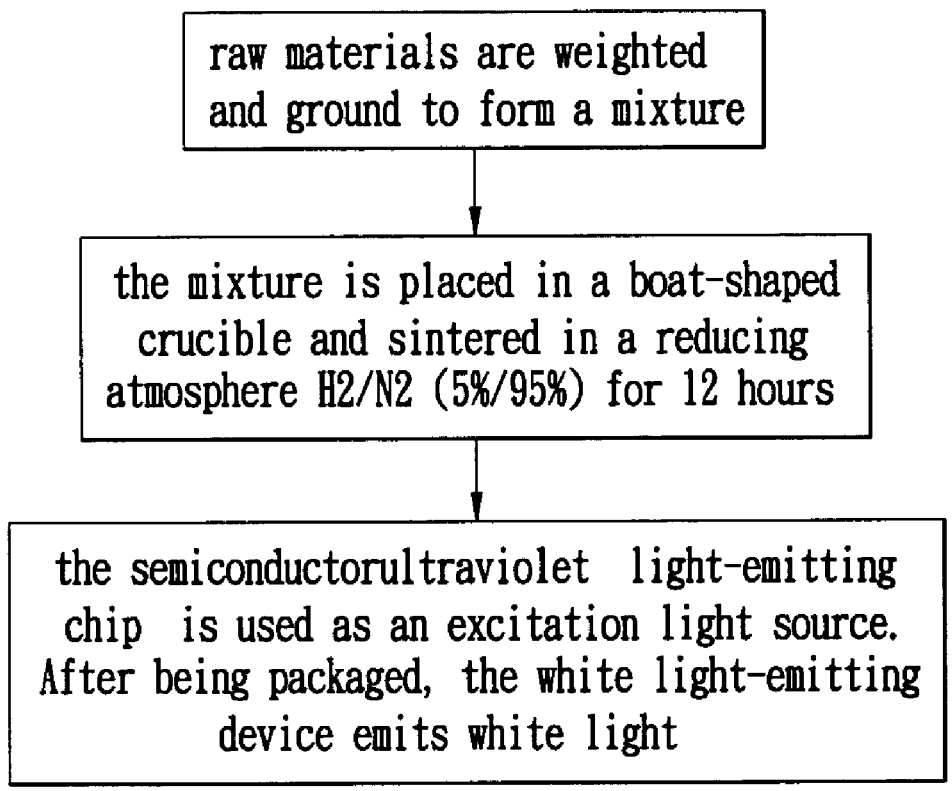
FIG. 5 is a flowchart describing production of a white light-emitting device according to one embodiment of the invention.

Referring to FIG. 5, the $(Ba_{1-x}M_x)Al_2O_4$ phosphor can be prepared by solid reaction or chemical synthesis. The solid reaction can be performed as follows:

Step 1: $Al_2O_3$, $BaCO_3$ and $Eu_2O_3$ are taken in stoichiometric amounts for forming $(Ba_{1-x}M_x)Al_2O_4$ (M is Eu), and ground to form a mixture.

Step 2: the mixture is placed in a boat-shaped crucible and sintered at 1500° C. (at a heating rate of 5° C./min) in a reducing atmosphere $H_2/N_2$ (5%/95%) for 12 hours. $Eu^{3+}$ ions are reduced, to $Eu^{2+}$ to obtain $(Ba_{0.9}Eu_{0.1})Al_2O_4$ with increased brightness.

Step 3: the semiconductor light-emitting chip emitting ultraviolet light with a wavelength of 400 nm is used as an excitation light source. After being packaged, the white light-emitting device emits white light in response to application of voltage.

Figure 6:
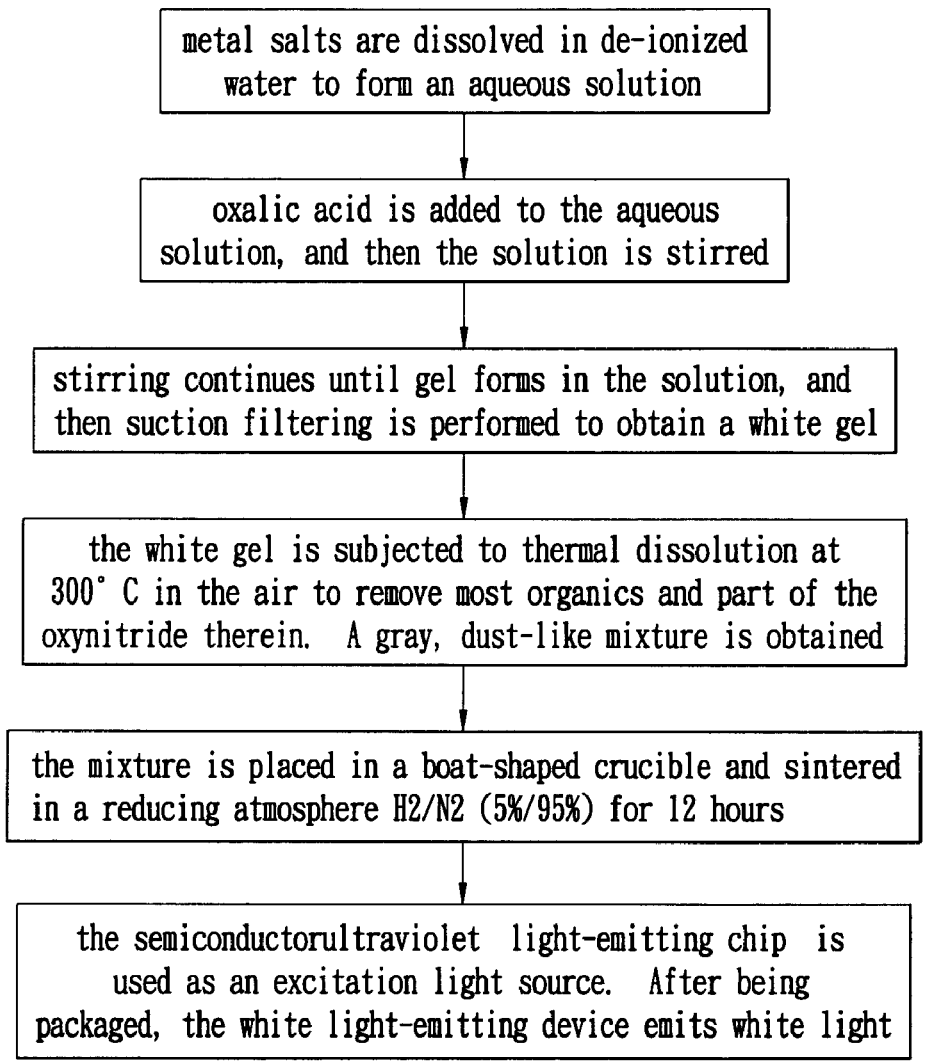
FIG. 6 is a flowchart of describing production of a white light-emitting device according to another embodiment of the invention.

Referring to FIG. 6, the $(Ba_{1-x}M_x)Al_2O_4$ phosphor can be prepared by citrate gel process as follows:

Step 1: $Al(NO_3)_3 \cdot 6H_2O$, $Ba(Cl)_3$ and $Eu(NO)_3 \cdot 6H_2O$ are taken in stoichiometric amounts for forming $(Ba_{1-x}M_x)Al_2O_4$ (M is Eu), and dissolved in de-ionized water to form an aqueous solution.

Step 2: oxalic acid is added to the aqueous solution, and then the solution is stirred for about 10 minutes.

Step 3: stirring continues until gel forms in the solution, and then suction filtering is performed to obtain a white gel.

Step 4: the white gel is subjected to thermal dissolution at 300° C. in the air to remove most organics and part of the oxynitride therein. A gray, dust-like mixture is obtained.

Step 5: the mixture is placed in a boat-shaped crucible, and sintered at 1500° C. (at a heating rate of 5° C./min) in a reducing atmosphere $H_2/N_2$ (5%/95%) for 12 hours. $Eu^{3+}$ ions are reduced to $Eu^{2+}$ to obtain $(Ba_{0.9}Eu_{0.1})Al_2O_4$ with increased brightness.

Step 6: the semiconductor light-emitting chip emitting ultraviolet light with a wavelength of 400 nm is used as an excitation light source. After packaging, the white light-emitting device emits white light in response to voltage applied thereto.

As described above, the semiconductor light-emitting chip is configured to emit light. The $(Ba_{1-x}M_x)Al_2O_4$ phosphor absorbs light emitted from the semiconductor light-emitting chip, and excites a first color light, where M is consisted of at least one Eu, Bi, Mn, Ce, Tb, Gd, La, Mg and Sr, 1>x>0.

The white light-emitting device of the invention enhances white light emission performance, and can be produced with a simple process and a low cost, as well. Therefore, it is of highly industrial utility It should be apparent to those skilled in the art that the above description is only illustrative of specific embodiments and examples of the invention, and should not be construed in a limiting way. Therefore, the invention should cover various modifications and variations made to the herein-described structure and operations of the invention, provided they fall within the scope of the invention as defined in the following appended claims.

What is claimed is:

1. A white light-emitting device, comprising:
   a semiconductor light-emitting chip, configured to emit light; and
   at least one $(Ba_{1-x}M_x)Al_2O_4$ phosphor to absorb the light emitted from the semiconductor light-emitting chip to emit white light, wherein M is selected from at least one of Eu, Bi, Mn, Ce, Tb, Gd, La, Mg and Sr, 1>x>0.

2. The device of claim 1, wherein light emitted from the semiconductor light-emitting device is ultraviolet light.

3. The device of claim 2, wherein a wavelength peak of ultraviolet light is in a range of about 300 nm to 400 nm.

4. The device of claim 1, wherein white light is of a wavelength ranging from about 400 to 700 nm.

5. The device of claim 1, wherein a second color of light is a red light of a wavelength ranging from about 585 nm to 640 nm.

6. The device of claim 1, wherein the at least one $(Ba_{1-x}M_x)Al_2O_4$ phosphor is prepared by solid reaction or chemical synthesis.

7. The device of claim 1, wherein the at least one $(Ba_{1-x}M_x)Al_2O_4$ phosphor is prepared by co-precipitation or citrate gel process.

8. The device of claim 1, further comprising encapsulant, and the encapsulant is mixed with the at least one $(Ba_{1-x}M_x)Al_2O_4$ phosphor in the form of powder.

9. The device of claim 1, wherein said $(Ba_{1-x}M_x)Al_2O_4$ phosphor includes $(Ba_{0.9}Eu_{0.1})Al_2O_4$ phosphor.

10. A white light-emitting device, comprising:
    a semiconductor light-emitting chip, configured to emit light; and
    $(Ba_{0.9}Eu_{0.1})Al_2O_4$ phosphor to absorb the light emitted from the semiconductor light-emitting chip to emit white light.

11. The device of claim 10, wherein light emitted from the semiconductor light-emitting device is ultraviolet light.

12. The device of claim 11, wherein a wavelength peak of ultraviolet light is in a range of about 300 nm to 400 nm.

13. The device of claim 10, wherein white light is of a wavelength ranging from about 400 to 700 nm.

14. The device of claim 10, wherein a second color of light is a red light of a wavelength ranging from about 585 nm to 640 nm.

15. The device of claim 10, wherein $(Ba_{0.9}Eu_{0.1})Al_2O_4$ phosphor is prepared by solid reaction or chemical synthesis.

16. The device of claim 10, wherein $(Ba_{0.9}Eu_{0.1})Al_2O_4$ phosphor is prepared by co-precipitation or citrate gel process.

17. The device of claim 10, further comprising encapsulant and the encapsulant is mixed with the $(Ba_{0.9}Eu_{0.1})Al_2O_4$ phosphor in the form of powder.

* * * * *